United States Patent
Karar et al.

(10) Patent No.: US 10,084,482 B2
(45) Date of Patent: Sep. 25, 2018

(54) SYSTEMS AND METHODS FOR INTERLEAVED CODED MODULATION WITH CONVOLUTIONAL CODING-BASED LOW-DENSITY PARITY CHECK CODES

(71) Applicant: Infinera Corporation, Sunnyvale, CA (US)

(72) Inventors: Abdullah Karar, Kingston (CA); Han Henry Sun, Ottawa (CA); Kuang-Tsan Wu, Ottawa (CA)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/190,137

(22) Filed: Jun. 22, 2016

(65) Prior Publication Data

US 2016/0373133 A1    Dec. 22, 2016

Related U.S. Application Data

(60) Provisional application No. 62/182,866, filed on Jun. 22, 2015.

(51) Int. Cl.
| | |
|---|---|
| *H03M 13/11* | (2006.01) |
| *H03M 13/25* | (2006.01) |
| *H03M 13/27* | (2006.01) |
| *H03M 13/29* | (2006.01) |
| *H03M 13/00* | (2006.01) |

(52) U.S. Cl.
CPC .... *H03M 13/1154* (2013.01); *H03M 13/1111* (2013.01); *H03M 13/1122* (2013.01); *H03M 13/255* (2013.01); *H03M 13/27* (2013.01); *H03M 13/2957* (2013.01); *H03M 13/6325* (2013.01)

(58) Field of Classification Search
CPC ............... H03M 13/27; H03M 13/255; H03M 13/1111; H03M 13/1122; H03M 13/1154; H03M 13/2957; H03M 13/6325
See application file for complete search history.

(56) References Cited

FOREIGN PATENT DOCUMENTS

EP    2991231 A1 *    3/2016    ........ H03M 13/1102

OTHER PUBLICATIONS

Chen et al., An efficient multirate LDPC-CCdecoder with layered decoding algorithm for the IEEE 1901 standard, Dec. 2014, IEEE Trans on circuits and sys. II express briefs, vol. 61, No. 12, pp. 992-996.*

* cited by examiner

*Primary Examiner* — Shelly A Chase
(74) *Attorney, Agent, or Firm* — David L. Soltz

(57) ABSTRACT

Various apparatus and methods may use iterative de-mapping/decoding to on received symbol estimates corresponding to interleaved coded modulation (ICM) using low-density parity check convolutional coding (LPDC-CC). The iterative de-mapping/decoding, may take the form of a multi-stage feed-forward arrangement that may include multiple identically designed stages, and the stages may use parallelism to increase speed and efficiency.

19 Claims, 9 Drawing Sheets

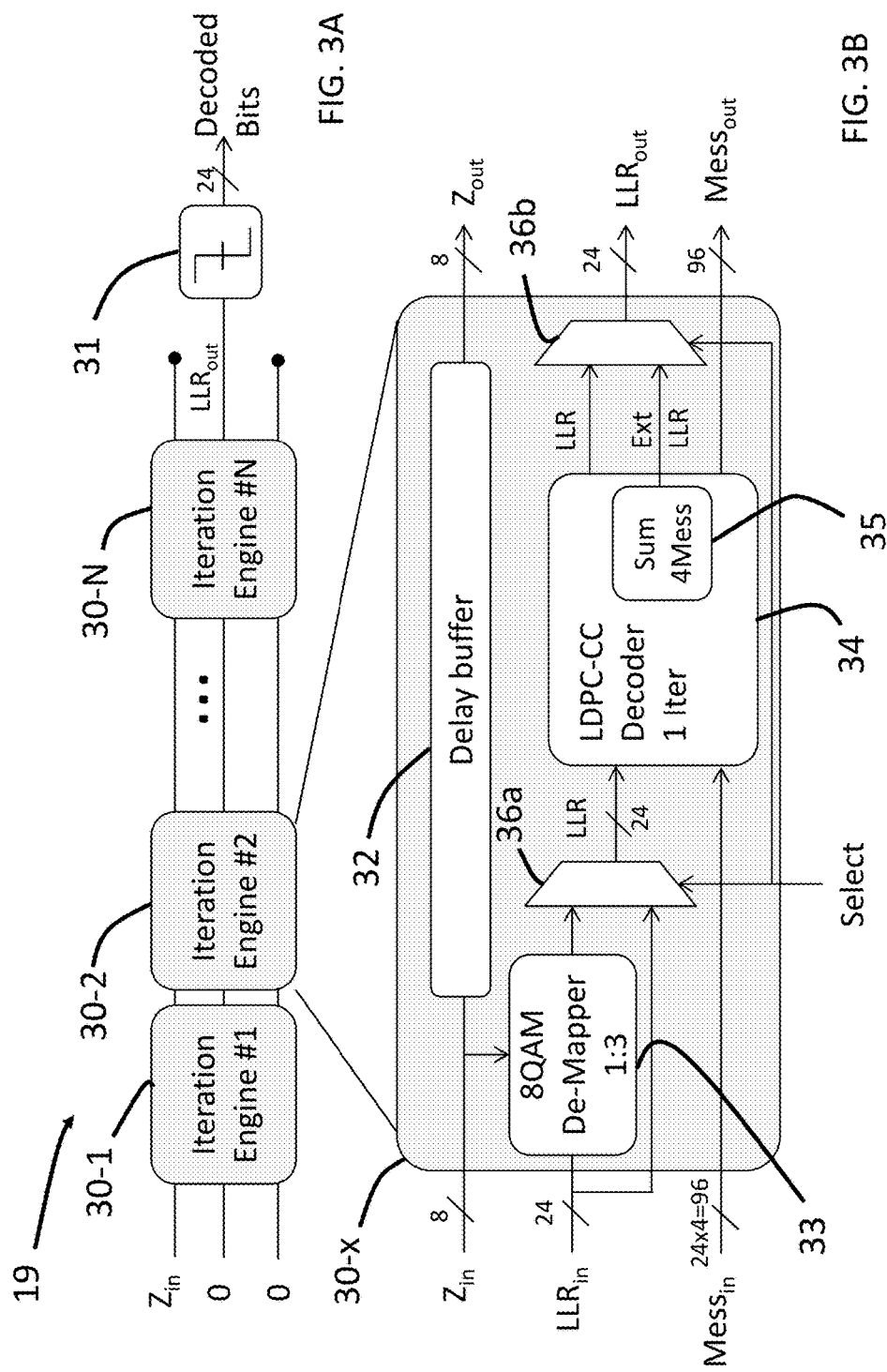

SYSTEMS AND METHODS FOR INTERLEAVED CODED MODULATION WITH CONVOLUTIONAL CODING-BASED LOW-DENSITY PARITY CHECK CODES

CROSS-REFERENCE TO RELATED APPLICATION

This application is a U.S. non-provisional patent application claiming priority to U.S. Provisional Patent Application No. 62/182,866, filed on Jun. 22, 2015, and incorporated by reference herein.

FIELD

Various aspects of the present disclosure relate to bit-interleaved coded modulation using iterative decoding techniques, which may be used in optical communication systems.

BACKGROUND

Many communication systems, for example, but not limited to, optical communication systems, may provide large bandwidths. In order to take advantage of such large bandwidths, non-binary ("M-ary") digital communication techniques may be desirable. At the same time, error-control coding may be needed to ensure reliable communications. In some cases, modulation and error-control coding may be combined in the form of what has come to be known as "coded modulation," in which the error-control coding and modulation may be integrated.

Early coded modulation techniques were largely focused on trellis-coded modulation using maximum-likelihood decoding. In trellis-coded modulation, an input data sequence may be used to directly select an encoded symbol in a signal constellation, according to, conceptually speaking, a trellis structure. See, e.g., Biglieri et al., Introduction to Trellis-Coded Modulation with Applications, New York: Macmillan Publishing Company, 1991, pp. 67-73. However, as time has passed, further coded modulation techniques have been developed. For example, block-coding techniques have been adapted to support coded modulation.

One class of codes that may have many desirable characteristics is the class of codes known as low-density parity check (LDPC) codes. Such codes may be characterized in that their parity check matrices (the matrices reflecting the constraint equations of the code, i.e., the combinations of bits for used in decoding) may be sparsely populated, in comparison with non-low-density codes. In other words, in a binary LDPC code, the percentage of 1's in the parity check matrix is low, compared with the percentage of zeros. See, e.g., J. K. Wolf, "An Introduction to Error Correcting Codes, Part 3," ECE 154 C Presentation Slides, U. of California at San Diego, Spring 2010 (available at circuit.ucsd.edu/~yhk/ece154c-spr16/pdfs/ErrorCorrectionII-I.pdf); see, also, Robert G Gallager, Low Density Parity Check Codes. Monograph, M.I.T. Press. (available, e.g., at www.inference.phy.cam.ac.uk/mackay/gallager/papers/ldpc.pdf). One advantage to this may be that using a message passing decoding algorithm over a sparsely populated parity check matrix may result in good convergence properties and near-optimal performance (noting that optimum performance may correspond to maximum-likelihood decoding; however, maximum-likelihood decoding of LDPC codes is an NP-complete problem and thus impractical, so suboptimal algorithms must be used in practical systems).

LDPC codes may be of various types, but may generally fall into two classes: block and convolutional. LDPC block codes (LDPC-BC) may be formed in a manner similar to conventional block codes, in which parity check bits may be computed based on combinations of finite blocks of input data bits and may be transmitted with the input data bits. Convolutional code-based LDPC codes (LDPC-CC) may be constructed based on concepts similar to convolutional codes, in which input data bits may be combined to form output bits that are combinations of the input data bits; a difference between block and convolutional codes is that, if the input bits to a convolutional code are considered in terms of blocks, there may be memory in the output bits in that a given output bit may be computed based on input bits from more than one input block (binary convolutional encoders may generally have memory/delay elements and binary adders).

Decoding of LDPC codes may typically be implemented, conceptually, by means of "message passing" algorithms. A message passing algorithm is most often depicted as a trellis of nodes, where the nodes perform computations of various probabilities regarding the bits of the received code symbols; some of the nodes may generally correspond to output bit values, and some of the nodes may correspond to values of the parity checks (i.e., the code symbols (bits), which may represent combinations of the transmitted bit values). The "messages" that are passed may represent various probabilities of output bits taking particular values (1 or 0), based on the information available at the node. This may give rise to iterative decoding schemes based on a potential increase in available information with the processing of more received code symbols. However, because the ideal decoding may involve extremely long numbers of received code symbols, in practice, the number of received code symbols considered prior to making a final decision on an output bit may be limited.

On a further note, while LDPC codes are generally characterized by a lower percentage of ones than zeros in the code's parity check matrix, how low "low-density" means may often be determined heuristically. In particular, the message passing techniques used in decoding LDPC codes may generally be sensitive to cycles that may form in a code diagram with nodes representing bits and other nodes representing checks. Such cycles may form when messages passed from a given bit node or check node end up being propagated back to the same bit node or check node, which may amount to the same information looping within the decoder, which may cause confusion and, in some cases, decoder failure. Therefore, one measure of a maximum density that constitutes a "low-density" code may be a maximum percentage of ones in the parity check matrix such that a message passing decoder does not fail. Again, this may be determined heuristically.

Bit interleaving may be used in conjunction with (binary) LDPC codes. Interleaving may be used to effectively disperse errors in adjacent transmitted bits by "mixing up" the bits. Symbol interleaving, a generalization of bit interleaving, may similarly disperse adjacent transmission errors (although it is noted that if a symbol is formed by multiple bits, one or more of the bits comprising an erroneous symbol may be affected; however, symbol interleaving may still result in some degree of bit error dispersion).

The above techniques may be combined into bit-interleaved coded modulation (BICM), or more generally, interleaved coded modulation (ICM) systems. BICM may use a binary code (i.e., a code the inputs and generates bits), such as an LDPC code, followed by a bit interleaver, and the interleaved bits may then be mapped to modulation symbols. Alternatively, encoded bits (e.g., using an LDPC code) may be mapped into symbols, and the symbols may be interleaved using a symbol interleaver.

One challenge that may arise is using such techniques with higher-order modulation techniques, such as, but not limited to, M-ary quadrature amplitude modulation (M-QAM), e.g., but not limited to the case with M being 8 (8QAM). In particular, the complexity and efficiency (e.g., in terms of amount of processing time needed, number of computations, complexity of connectivity (e.g., number of connections/memory accesses), amount of memory needed, and the like) of decoding/demodulating the ICM symbols using higher-order modulation may be difficult to implement efficiently using known techniques (which mostly address conventional binary, or at most, conventional quaternary (4-ary) transmission systems). Some of the factors behind this may include, e.g., the increased number of bits per symbol and its effects on de-mapping and decoding, in terms of having greater interaction between/among encoded bits (or, in other words, each decoded bit affecting multiple other encoded bits to a higher degree) and the additional hardware and/or computational time to account for this. Thus, it may be desirable to develop techniques that may improve upon the efficiency of known techniques, and which may be amenable to use with other modulation types, which may include higher-order modulation techniques and techniques that may provide improved spectral efficiency, e.g., but not limited to, dual-polarization symbol transmission (which may be useful, e.g., in optical communication systems).

SUMMARY OF VARIOUS ASPECTS OF THE DISCLOSURE

Various aspects of the present disclosure may relate to use of ICM with higher-order modulation techniques, such as, but not limited to, M-QAM (e.g., 8QAM) or non-conventional binary or quaternary modulation (e.g., but not limited to, extended binary phase-shift keying (eBPSK)), and the use of iterative demapping (ID) in conjunction therewith (the combination of ICM with ID may be denoted "ICM-ID"). The iterative demodulation/decoding may take the form of a multi-stage feed-forward arrangement.

Implementations may be in the form of hardware, software, firmware, or combinations thereof, including executable instructions stored on a non-transitory computer-readable medium, e.g., a memory device, that may be executed on one or more processing devices.

BRIEF DESCRIPTION OF THE DRAWINGS

Various embodiments of the invention will now be described in conjunction with the accompanying drawings, in which:

FIG. 3A shows a conceptual block diagram of an interactive decoder according to various aspects of the present disclosure;

FIG. 3B shows a conceptual block diagram of a stage of the iterative decoder of FIG. 3A, according to various aspects of the present disclosure;

DETAILED DESCRIPTION OF VARIOUS ASPECTS OF THE DISCLOSURE

Various aspects of this disclosure may relate to interleaved coded modulation with iterative demapping (ICM-ID). According to various aspects of this disclosure, the modulation type may be of order greater than or equal to two, and the coded modulation may be based on low-density parity check convolutional codes (LDPC-CC). As noted above, an LDPC code is one in which the parity check matrix of the code is sparsely populated with ones, corresponding to relatively simple parity check computations. An LDPC-CC is a convolutional code that, similarly, has a sparse parity check matrix. In particular, various aspects of the present disclosure may address the use of LDPC-CC in conjunction with higher-order (non-binary) modulation, and particularly with modulation orders of three or greater; however, the disclosed techniques may also be used with lower-order modulation (modulation orders of one or two). The LDPC-CC decoder, according to aspects of this disclosure, may be of an iterative feed-forward type, having multiple concatenated identical stages that propagate information from one to the next, without feedback between/among the stages. A given stage may generate soft-decision information (e.g., but not limited to, log-likelihood ratios), which may reflect the likelihood that a given output bit has a particular value (0 or 1), as opposed to a hard decision, where the bit value (0 or 1) is given. The soft-decision information may be refined, to improve its accuracy, as the stages are traversed, and after some number of stages, a hard decision may be made, based on the soft-decision information (which may be the soft-decision information output from a final stage), regarding the decoded information bits, e.g., by comparing the soft-decision information to a threshold value to decide on a 0 or a 1 for a given bit. Such coded modulation and decoding/demodulation may be useful, e.g., in optical communication systems.

The LDPC-CC decoder, according to various aspects of the present disclosure, may improve upon prior techniques, e.g., by using a feed-forward multi-stage architecture, without feedback between stages, in which parallelization of operations may be exploited to provide high efficiency and reduced computational time and still provide good performance.

Figure 1:
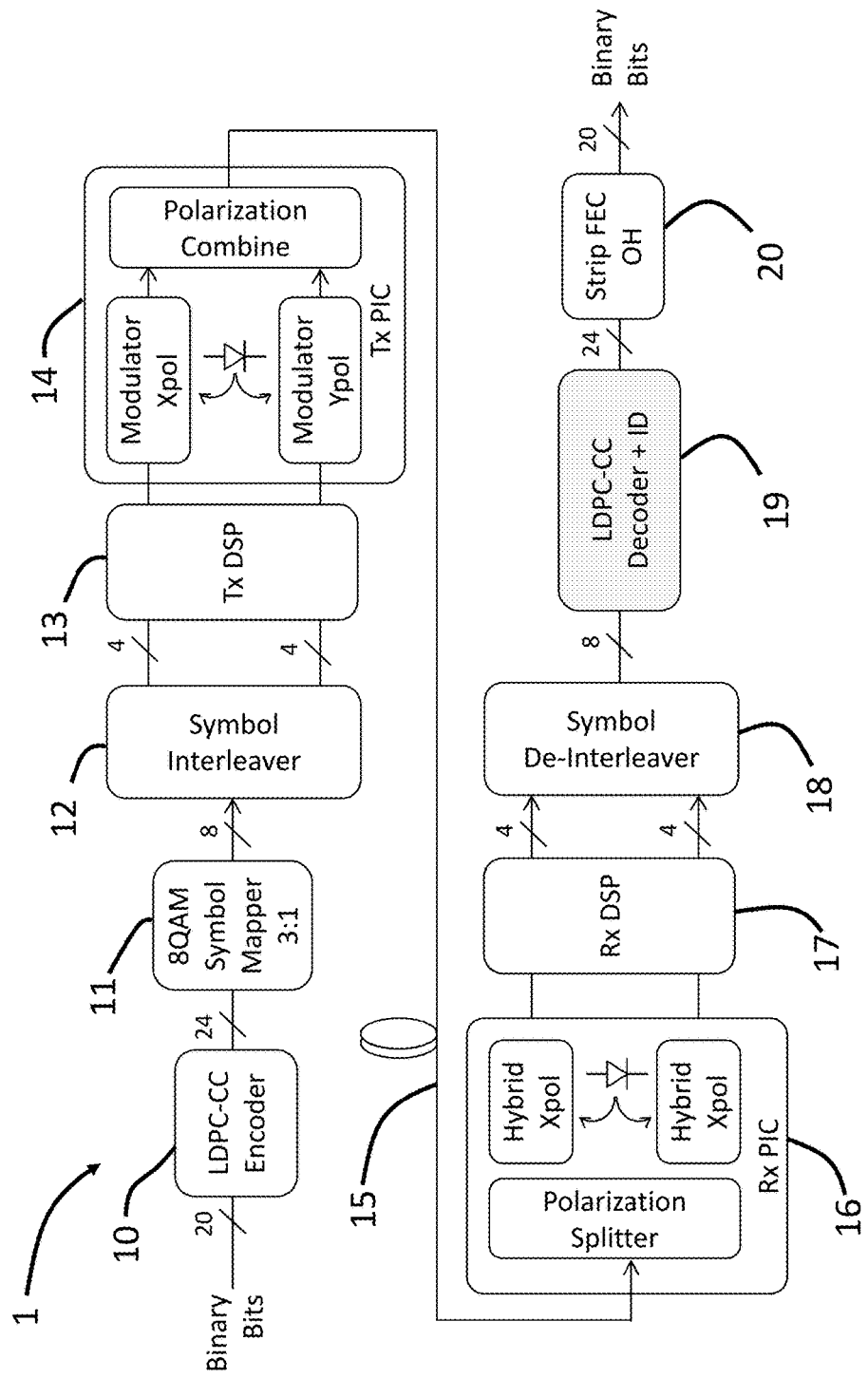
FIG. 1 shows a conceptual block diagram of a communication system that may incorporated various aspects of the present disclosure.

FIG. 1 shows an example of a communication system 1 according to various aspects of this disclosure. Binary bits may be input to an LDPC-CC encoder circuit 10. In the example of FIG. 1, which is not intended to be limiting, the LDPC-CC encoder 10 may output 24 bits for every 20 bits that are input. The output bits may then be fed into a symbol mapper circuit 11. In the example of FIG. 1, the symbol mapper 11 is an 8QAM symbol mapper that may map groups of three input bits into single modulation symbols; however, this is not limiting, either in terms of the modulation type or the dimension. The symbols may then be interleaved by symbol interleaver 12; it is noted that this may provide a distinction from BICM in that the (non-binary) symbols may be interleaved, as opposed to bits. The interleaved symbols may then be processed for transmission, e.g., in a transmission digital signal processor circuit (DSP) 13 and modulated/polarized/combined and transmitted 14. In one example, shown in FIG. 1, transmission may be over an optical fiber 15; alternatively, other types of channels may be used. In the case, of transmission over an optical medium, such as, but not limited to, optical fiber 15, the hardware of block 14 may include Mach-Zehnder (MZ) modulator pairs, which may be nested pairs, and which may be provided on a photonic integrated circuit (PIC). A first pair may modulate light output from a laser to provide first in-phase and quadrature components of a first optical signal. Second light output from the laser may be modulated by a second nested MZ modulator pair to provide second in-phase and quadrature components of a second optical signal. The first optical signal may have a TE polarization, and the polarization of the second optical signal may be rotated by a rotator to have a TM polarization. The first and second optical signals may then be provided to a polarization combiner and output to an optical communication path that may, again, include an optical fiber. In addition, multiple lasers, nested MZ pairs, and polarization rotators, and combiners may be provided to generate a wavelength-division multiplexed (WDM) signal including a plurality of polarization multiplexed optical signals, each having a different wavelength.

The transmitted signals may be received at a receiver front-end 16, which may have hardware elements that may perform operations inverse to those performed in block 14. In receiver front-end 16, a received WDM signal may be supplied to a plurality of receiver PICs, each of which may include a polarization splitter that may separate the TE and TM components of each optical signal. A local oscillator laser may output continuous-wave (CW) light at a wavelength close to that of the particular optical signal to an optical hybrid circuit, which may mix the incoming TE and rotated TM (now TE) signals. The resulting mixing products may next be supplied to balanced photodiodes, which may generate corresponding electrical signals that may be amplified, for example, and fed to analog-to-digital conversion (ADC) circuits, the outputs of which may be supplied to Rx DSP 17. The resulting outputs of Rx DSP circuit 17, which may in the form of symbol estimates, may then be de-interleaved 18. The de-interleaver circuit 18 outputs (which may be the de-interleaved symbol estimates) may then be fed to an LDPC-CC decoder with iterative de-mapping 19 to obtain decoded bits, from which LDPC-CC overhead bits may then be stripped 20 to obtain binary bits, once again.

Figures 2A, 2B:
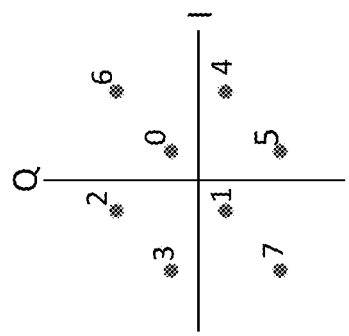
FIGS. 2A and 2B show a signal constellation of an example of a modulation type that may be used in various aspects of the present disclosure.

In some aspects of the present disclosure, it may be desirable to use symbol mapping 11 without Gray coding (i.e., in Gray codes, only a single bit changes in two successive symbols (e.g., from symbol 0 to symbol 1 and from symbol 1 to symbol 2, etc.)). FIGS. 2A and 2B show an example of a form of 8QAM in which it may be understood that perfect Gray coding is not used (i.e., the mapping of bits to symbols does not follow Gray coding, although it may be close). FIG. 2A shows a constellation in complex space, and FIG. 2B shows an example of the values of the corresponding real (Re) and imaginary (Im) components of the symbols in the example 8QAM constellation. Note that although this particular example may be used throughout the ensuing discussion, the invention is not limited to 8QAM or to this particular form of 8QAM. For example, it is noted that ICM-ID may be applicable to multi-dimensional modulations coded over the in-phase, quadrature, time and/or frequency of an optical signal using a lower-order code (e.g., a block code, such as a Hamming code).

FIGS. 3A and 3B show conceptual block diagrams that may relate to implementations of LDPC-CC decoder and iterative demapper circuit 19, shown in FIG. 1. As shown in FIG. 3A, an iterative process of decoding/demapping may involve a series of iteration circuits or "engines" 30-1, 30-2, ..., 30-N. In one non-limiting example, N may equal twelve, and the iteration engines 30-1, 30-2, ..., 30-N may be of identical structure. The inputs to iteration engine #1 30-1 may be the symbol estimate(s) $Z_{in}$ output from symbol de-interleaver 18. Using the example of 8QAM, $Z_{in}$ may be eight symbols (again, this is only an example, without intended limitation). The other initial inputs may all be equal to zero. The output of the final iteration engine 30-N may be a soft-decision output. In the example shown in FIG. 3A, this is labeled "$LLR_{out}$" and may represent a log-likelihood ratio that a given bit is zero or one. For example, if $LLR_{out}$ is greater than zero, the bit may be more likely to be a one, and if $LLR_{out}$ is less than zero, the bit may be more likely to be a zero. Accordingly, a decision device 31 may test the value of $LLR_{out}$ (e.g., by comparing it to zero) and may make a decision as to a bit value. Note that the disclosure is not limited to this particular implementation of a log-likelihood ratio test, or even to the use of log-likelihood ratios, and other indicators of bit likelihood and/or other tests may be used for decision device 31.

FIG. 3B shows an example of a structure of an iteration engine 30-x (x=1, 2, ..., N). As shown, the inputs to iteration engine 30-x may be $Z_{in}$, $LLR_{in}$, and $Mess_{in}$. As noted above, $Z_{in}$ may correspond to symbol estimates from symbol de-interleaver 18, in the case of iteration engine 30-1, or it may correspond to symbol estimates output from a previous iteration engine in the chain of iteration engines 30-1, 30-2, ..., 30-N. Similarly, for iteration engine 30-1, the inputs to $LLR_{in}$ and $Mess_{in}$ may both be zeros. For subsequent iteration engines 30-2, ..., 30-N, these may be outputs of a previous iteration engine (30-1, ..., 30-(N−1), respectively). The outputs of iteration engine 30-x may be $Z_{out}$, $LLR_{out}$, and $Mess_{out}$. These quantities may be input to inputs $Z_{in}$, $LLR_{in}$, and $Mess_{in}$ of a next iteration engine (30-(x+1)), or for iteration engine 30-N, only $LLR_{out}$ may be used, as a decision variable for decision device 31.

To further explain the inputs and outputs of an iteration engine 30-x, $Z_{out}$ may correspond to symbol estimates $Z_{in}$ delayed in a delay buffer or memory 32. Delay buffer 32 may serve to synchronize the outputs. Also regarding the symbol estimates, as shown in FIG. 3B, there may be eight symbol estimates in the 8QAM example, to which this disclosure is, again, not limited.

Similarly, in the 8QAM example, there may be 24 log-likelihood ratios (or other soft-decision values) passed into ($LLR_{in}$) and out of ($LLR_{out}$) a given iteration engine 30-x. These may correspond to the 24 bits forming the eight symbols of $Z_{in}/Z_{out}$. The $LLR_{in}$ values may be input, along with the symbol estimates $Z_{in}$, to a de-mapper 33. In the ongoing 8QAM example, de-mapper circuit 33 may de-map one symbol to three bits; again, this is not to be understood as limiting. De-mapper 33 may be a soft-decision demapper, outputting soft decision data for each bit, e.g., a log-likelihood ratio for a respective bit. An example of de-mapper 33 will be discussed below.

The final inputs/outputs, $Mess_{in}$ and $Mess_{out}$, may represent "messages" passed from iteration engine to iteration engine. These "messages" may represent extrinsic information obtained during the decoding process of LDPC-CC decoder 34. "Extrinsic information" may refer to information obtained in a previous stage of decoding, and which may be used, e.g., to reflect a portion of the soft-decision information output from the previous stage that depends on redundant information introduced by the LDPC-CC encoding. These message values and their determination will be discussed further below. However, it is noted that, in the 8QAM example, the LDPC-CC code being used, e.g., as shown in FIG. 1, may take twenty input bits and output twenty-four encoded bits. Hence, in this example, considering the equivalent "message passing" decoding scheme, there are thus twenty-four variables (bits) and four "checks" formed based on the twenty-four variables, resulting in 96 total "messages." Note that these numbers are not limiting and, in general, may depend on the particular LDPC-CC scheme being used.

Figure 4:
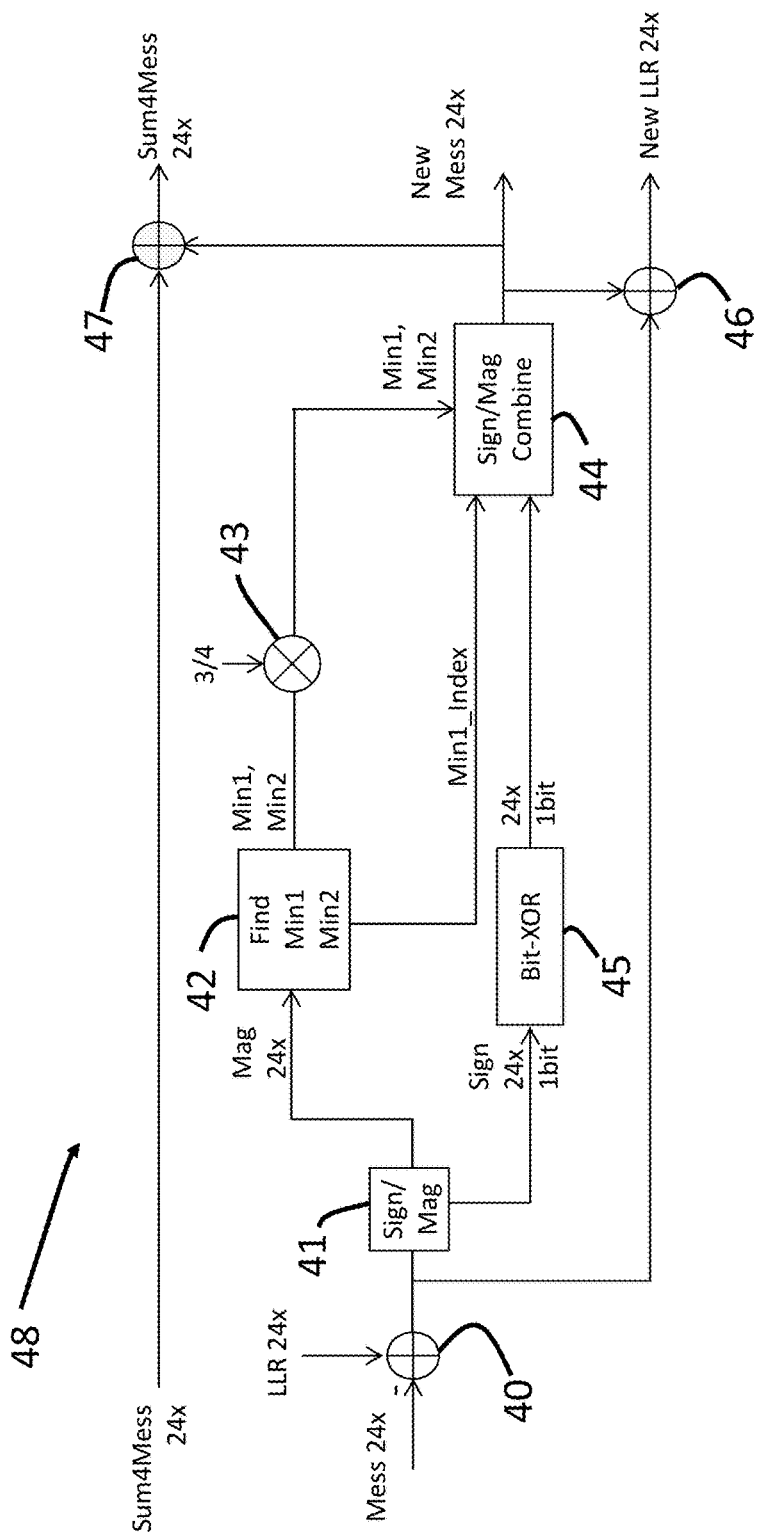
FIGS. 4 and 4A show a conceptual block diagrams of components of the stage of FIG. 3B, according to various aspects of the present disclosure.
Figure 4A:
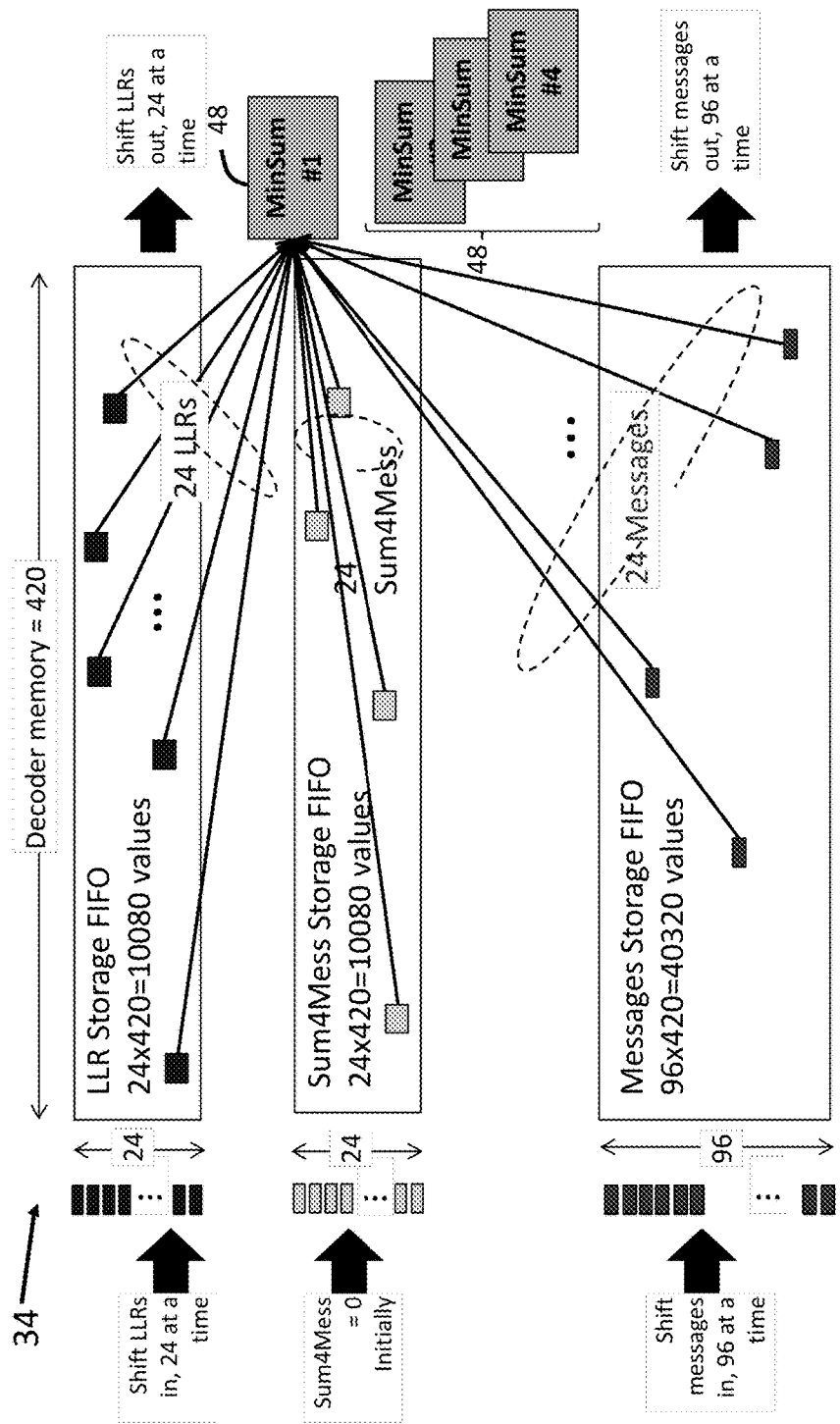

As noted above, iteration engine 30-$x$ may include a single-iteration LDPC-CC decoder 34, which may include a Sum4Mess device 35. Single-iteration LDPC-CC decoder 34 may be implemented as a feed-forward version of a min-sum message passing decoder, but including Sum4Mess 35. An example of such a single-iteration LDPC-CC decoder circuit 34 is shown in FIG. 4A, and an example of a min-sum message passing decoding branch circuit 48, as shown in FIG. 4A, of single-iteration LDPC-CC decoder 34 is shown in FIG. 4. As noted above, the single-iteration LDPC-CC decoder 34 may be implemented using a min-sum architecture 48, as shown in FIG. 4, but with an extra addition block 47, which may act as the Sum4Mess device or circuit 35. The inputs to decoder 34 may include the Mess$_{in}$ of the present iteration engine 30-$x$ and soft-decision (LLR) information either generated internally by de-mapper 34 or input to iteration engine 30-$x$ as LLR$_{in}$. Noting that the soft-decision (LLR) information and the message (Mess) information may both be provided as parallel information (24 parallel lines to each min-sum decoder branch 48, in the example shown), the message information may be subtracted from the soft-decision information in parallel, which may be performed by parallel adder circuit 40. The output of parallel adder 40 may be fed to (parallel) sign/magnitude device 41 and to another parallel adder 46. Sign/magnitude block or circuit 41 may, in parallel, obtain the signs and magnitudes of the results obtained from parallel adder 40. The magnitudes may be fed to a block 42 that may determine the two smallest magnitude values, Min1 and Min2 and may also provide an index corresponding to the global minimum value, Min1_Index (e.g., if, out of 24 values, the 18$^{th}$ value is the lowest, Min1_Index=18). Min1 and Min2, as the two smallest magnitudes of the parallel differences computed by parallel adder 40, may represent the two cases in which the LLR values are closest to the Mess values (or, in other words, the intrinsic information is closest to agreement with the extrinsic information). The determination of Min1 and Min2 may be based on the consideration of how one may wish to adjust the various parallel values; Min 1 may be the global minimum and may be used to adjust all of the values except those to which it corresponds (i.e., that corresponding to Min1_Index), while Min 2, the next smallest magnitude value, may be used to adjust the magnitude value corresponding to Min1_Index.

Min 1 and Min 2 may be multiplied by a scale factor at multiplier circuit 43. The scale factor may be ¾, but it is not thus limited, and a desired value may be determined experimentally. The two scaled values of Min1 and Min2 may then be fed to sign/magnitude combiner circuit 44, along with Min1_Index, which may generate new message information, New Mess in parallel (again, in the present example, 24 parallel values), using sign information obtained using the signs obtained from sign/magnitude device 41 and further processed, as well be discussed below.

The signs obtained by sign/magnitude device 41 may be represented as single bits, in the present example, 24 bits, which may be passed in parallel to Bit-XOR circuit 45. Bit-XOR 45 may be implemented to perform 24 23-bit XOR operations in parallel, for example. Each 23-bit XOR operation may perform an exclusive-OR on the 24 input sign bits, except for the one sign bit corresponding to a "present position." To clarify this, consider that the sign bits in the present example may be represented as $s_1, s_2, \ldots, s_{24}$. For the first position (i.e., the sign bit corresponding to a first output of sign/magnitude device 41), the Bit-XOR 45 may output a value $s'_1 = s_2 \oplus s_3 \oplus \ldots \oplus s_{24}$. For the second position, the Bit-XOR 45 may output a value $s'_2 = s_1 \oplus s_3 \oplus \ldots \oplus s_{24}$, and so on, up to the 24$^{th}$ position, for which the Bit-XOR 45 may output a value $s'_{24} = s_1 \oplus s_2 \oplus \ldots \oplus s_{23}$. The outputs from Bit-XOR 45 may be passed, e.g., in parallel, to sign/magnitude combiner 44.

At sign/magnitude combiner 44, in the present example, 24 one-bit sign bit XOR combinations (from Bit-XOR 45), the two smallest magnitude values (Min1 and Min2), and the index of the smallest magnitude value (Min1_Index) may be received as inputs. Sign/magnitude combiner 44 may take each sign bit XOR combination and use its sign with one of the two magnitude values, Min1 or Min2, to create a respective signed-magnitude value. This may be done by combining Min1, as a magnitude, with all of the sign bit XOR combinations except for the sign bit XOR combination corresponding to Min1_Index (i.e., using the representation above, $s'_{Min1\_Index}$), which may be combined with Min2 as its magnitude. As a result, sign/magnitude combiner 44 may output, e.g., in parallel, an array of signed-magnitudes that may form new message data "New Mess". New Mess may be combined in parallel, at parallel adder 46, with the respective parallel outputs of parallel adder 40, to obtain new parallel soft-decision data, which may be in the form of log-likelihood ratios, "New LLR." As usual, in the present example, there may be 24 New LLR values, but this is not limiting.

The parallel New Mess values may also be added to parallel input Sum4Mess values at parallel adder 47 to generate an updated (parallel) Sum4Mess, which may keep running sums of the message values in a particular min-sum decoder branch 48.

As noted above, FIG. 4 represents one min-sum decoder branch 48 of single-iteration LDPC-CC decoder 34. In general, there may be K versions of this, which may be implemented in parallel, where K corresponds to the number of parity equations ("constraints") of the particular convolutional encoding scheme being used (the "CC" of the LDPC-CC). The code being used in the illustrated example may have four constraints, and therefore, the single-iteration LDPC-CC decoder 34 may have four min-sum decoder branches 48, one for each of the constraints, as illustrated in FIG. 4A. (Note that "constraint" is being used here as a term different from "constraint length," a term-of-art in convolutional coding that refers to a measure of "memory" or "word length" of a convolutional code.)

By way of further explanation, in one implementational example, each stage 30-$x$ may contain memory, as shown in FIG. 4A, that may be used to store the LLR values fed to the LDPC-CC decoder 34 and Mess$_{in}$ values, as well as Sum4Mess values, as they are computed and updated within stage 30-$x$; note that in each stage 30-$x$, the Sum4Mess values may be initiated to all zeros. These may be separate memory devices, or two or more of these may be combined into a given memory device, using different sections of the memory device for the different types of values. The memory may be implemented as one or more first-in-first-out (FIFO) parallel memory segments. In one implementation that may relate to the illustrated example, the lengths of the FIFO parallel memory segments may be 420 words (values); but this is not intended to be limiting and may be determined, e.g., based on the design of the LDPC-CC code and/or other factors. To further explain, for example, in the illustrated example, there may be 24 LLR values, and each of these LLR values may represent soft-decision information for a given bit. The LLR values may be propagated through the memory in parallel, shifting once per clock cycle, until they have, in parallel, traversed all 420 memory locations.

Each of the min-sum decoder branches 48 of LDPC-CC decoder 34 may operate on and update values (i.e., it may write back values to the same memory locations) in memory locations corresponding to the particular constraint to which the branch 48 corresponds. In the illustrated example, a given branch 48 may access 24 LLR, 24 Mess (it is noted that there may be four sets of 24 Mess values, one set corresponding to each branch 48, giving 96 total Mess values, as indicated in FIG. 3B; but a branch 48 may only access its own corresponding 24 Mess values, corresponding to the 24 Mess values shown in FIG. 4, as each branch 48 may generate its own extrinsic information (Mess values) that may be passed along to a next stage 30-x, also as shown in FIG. 4) and 24 Sum4Mess memory locations per clock cycle. However, because the LDPC-CC code is low-density, a given branch 48 of LDPC-CC decoder circuit 34 may only operate on and update a small number of the values, as they are propagated through the memory. In one illustrative example, each of the 24 LLR values may be updated four times as it propagates through the memory, once by each of the four branches 48, the Mess values for a given branch 48 may only be updated once by that branch 48; and the Sum4Mess values may be updated four times, once by each branch 48, corresponding to adding that branch's Mess values to the Sum4Mess values (i.e., the Sum4Mess values may correspond to running summations of the respective Mess values of the four branches 48).

In some cases, it may, improve efficiency even further to incorporate additional parallelization. For instance, in the illustrated example, although only a single LDPC-CC decoder 34 is shown, there may be multiple LDPC-CC decoders 34 configured to run in parallel. As a result, in the illustrated example, in one implementation, this may be twenty-one LDPC-CC decoders, each having four branches (as discussed above), for a total of 84 min-sum decoding branches 48.

Returning to FIG. 3B, two multiplexers, 36a and 36b may also be included in iteration engine 30-x. Even though there may be N total iteration engines, a user may wish to (partially) deactivate one or more of the iteration engines, which may provide power savings by performing only some of complete iterations, e.g., with optimized scheduling. In particular, a select input may be provided to both multiplexer circuits 36a and 36b. In the case of full activation, demapping and decoding may be performed in full. As such, the LLR values selected by multiplexer 36a to be fed to LDPC-CC decoder 34 may be the LLR values generated by de-mapper circuit 33, and the $LLR_{out}$ may be selected at multiplexer 36b to be the updated Sum4Mess values shown in FIG. 4. In the case of (partial) deactivation, de-mapping may not be performed at de-mapper 33, and the LLR values selected by multiplexer 36a may correspond to the input LLR values, $LLR_{in}$. The LDPC-CC decoder 34 may provide updated LLR values, shown as "New LLR," which may be selected at multiplexer 36b to be the output LLR values, $LLR_{out}$. Any subset of the N iteration engines 30-x may be selected for activation or partial deactivation. The result of partial deactivation of one or more iteration engines may be some reduction in noise tolerance of the overall system, but this may, in some cases, be outweighed by the savings in energy consumption.

Another variation is that symbol values Z may have higher resolution (more bits) in earlier de-mapping stages and lower resolutions in later de-mapping stages, which may, again result in savings in energy consumption.

Figure 5:
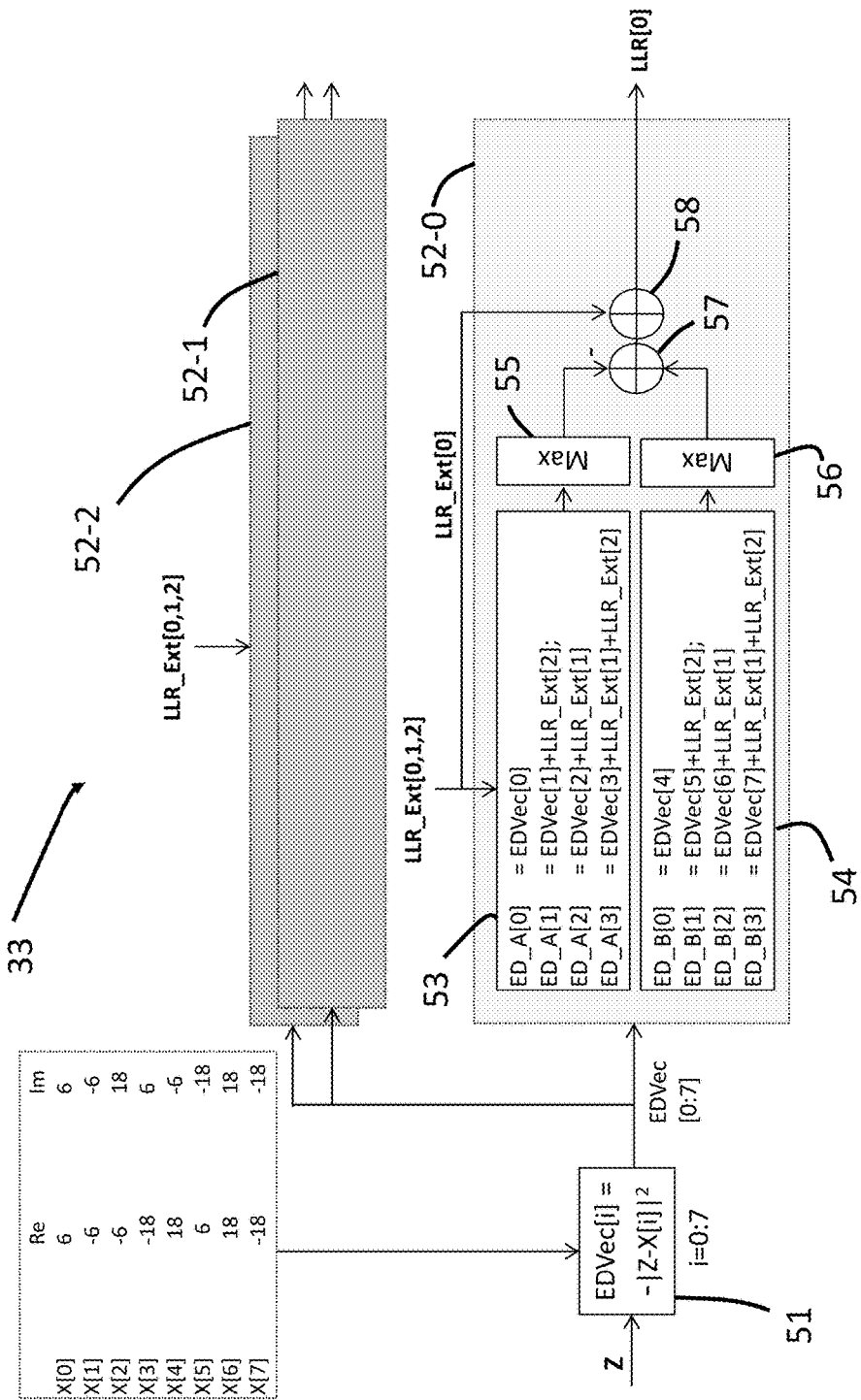
FIG. 5 shows a conceptual block diagram of a further component of the stage of FIG. 3B, according to various aspects of the present disclosure.
Figure 6:
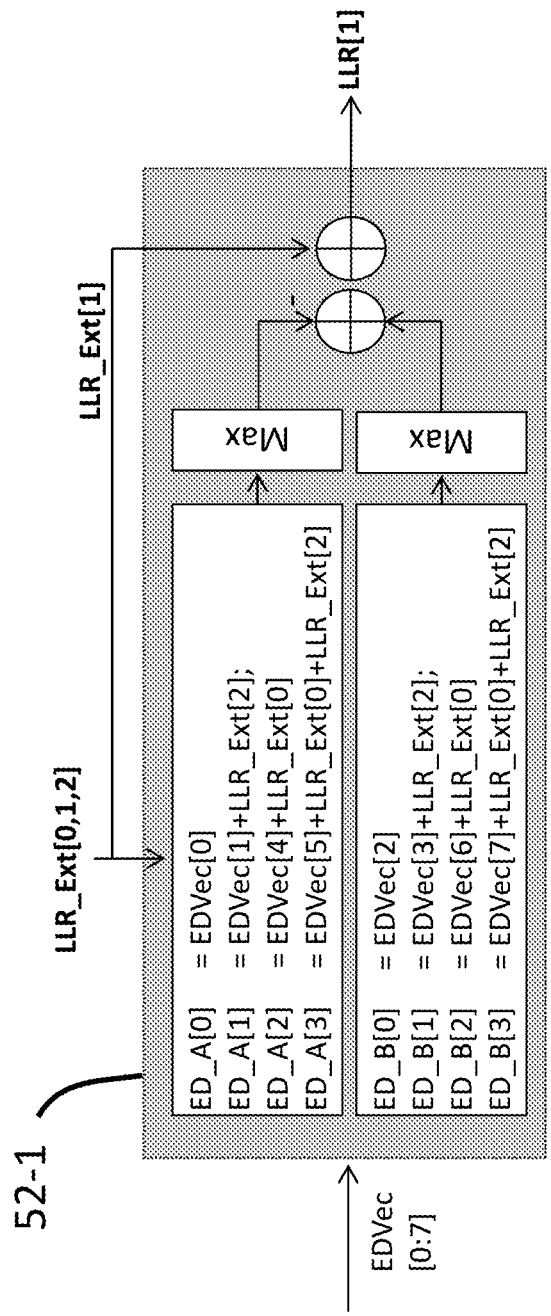
FIGS. 6 and 7 show conceptual block diagrams of components of FIG. 5, according to various aspects of the present disclosure.
Figure 7:
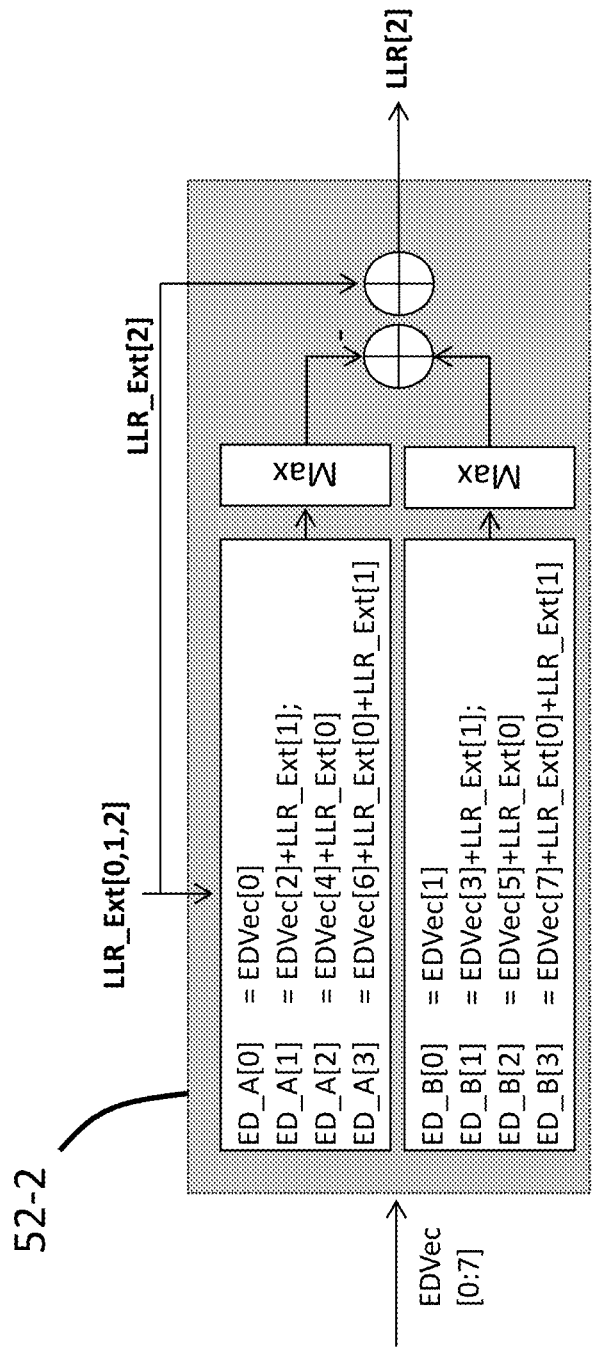

As noted above, iteration engine 30-x may include a de-mapper 33 (an 8QAM de-mapper, in the illustrated example, but not limited thereto). FIGS. 5-7 illustrate conceptual block diagrams of how de-mapper 33 may be implemented. The symbol estimates $Z_{in}$ may generally be complex values and may be fed to a Euclidean distance calculator 51, which may compute, e.g., in parallel, Euclidean distances between $Z_{in}$ and each complex-valued signal constellation point, X[i], i=0, 1, 2, ..., M−1 (in the illustrated example, i=0, 1, 2, ..., 7, in an 8QAM scheme) and may thereby generate a vector of M Euclidean distance values, EDVec[0:M−1]. In an 8-ary scheme, such as 8QAM, each 8-ary symbol represents three bits, Bit-0, Bit-1, and Bit-2. Similarly, in a $2^k$-ary scheme, each $2^k$-ary symbol may represent k bits, Bit-0, Bit-1, ..., Bit-(k−1). Soft-decision information, e.g., a log-likelihood ratio (LLR) may be determined for each individual bit. For the illustrated example, with three bits, this may be performed in three branches/circuits, 52-0, 52-1 and 52-2, corresponding to Bit-0, Bit-1 and Bit-2, respectively (in general, there may be k such branches). As illustrated in FIG. 3B, $LLR_{in}$ may be input to de-mapper 33. In the illustrated example, $LLR_{in}$ may contain 24 LLR values, which may represent extrinsic information regarding the likelihood of each bit in each of the 8 symbols, $Z_{in}$. In a non-Gray coded 8QAM scheme, in the illustrated example, the following may represent the correspondences between the different constellation points and the three bits represented thereby:

X[0]<-->0 0 0
X[1]<-->0 0 1
X[2]<-->0 1 0
X[3]<-->0 1 1
X[4]<-->1 0 0
X[5]<-->1 0 1
X[6]<-->1 1 0
X[7]<-->1 1 1.

That is, X[0]-X[3] may correspond to cases in which the left-most bit, Bit-0, is equal to 0, and X[4]-X[7] may correspond to cases in which Bit-0=1. Similarly, for each of Bit-1 and Bit-2 (the middle and right-most bits), there may be four constellation points corresponding to the given bit (Bit-1 or Bit-2) being equal to 0 and four constellation points corresponding to the given bit being equal to 1. Block/Circuit 52-0 of FIG. 5 corresponds to computations/a computing device that may be used to obtained a soft-decision value (e.g., a log-likelihood ratio) for Bit-0, Block/Circuit 52-1 may do the same for Bit-1, and Block/Circuit 52-2 may do the same for Bit-2. The details of Block/Circuit 52-0 will now be discussed, but the same computations/components, although they may use different values, may be used in Blocks/Circuit 52-1 and 52-2, as illustrated in FIGS. 6 and 7.

In Block/Circuit 52-0, a first computation device 53 may determine adjusted Euclidean distance values corresponding to the constellation points corresponding to Bit-0=0, and a second computation device 54 may perform corresponding computations corresponding to the case of Bit-0=1. As shown, adjusted Euclidean distance values ED_A[0:3] of first computation device 53 and ED_B[0:3] of second computation device 54 may be computed by adding to each respective Euclidean distance value ED[0:7] respective extrinsic information, in the form of input LLR values, labeled in blocks/circuits 53 and 54 as "LLR_Ext[x]" (which, again, may be obtained from the input LLR vector, $LLR_{in}$). The specific extrinsic information added may correspond to the cases in which the other bits, Bit-1 and Bit-2 in the illustrated example, take the value 1 in the case of the respective constellation point. As noted above, X[0]-X[3] may be constellation points that may correspond to Bit-0=0, and X[4]-X[7] may be constellation points corresponding to Bit-0=1. However, Bit-1 and Bit-2 may be equal to either 0 or 1 when Bit-0 equals either 0 or 1. Therefore, in first computation device 53, ED_A[0] may be computed as EDVec[0] because Bit-1=Bit-2=0 for X[0]. ED_A[1] may computed as EDVec[1]+LLR_Ext[2] because Bit-2=1 for constellation point X[1]; Bit-1=0 corresponds to no added value. Similarly, ED_A[2] may equal EDVec[2]+LLR_Ext[1] because Bit-1=1 for constellation point X[2] (and Bit-2=0). ED_A[3] may equal EDVec[3]+LLR_Ext[1]+LLR_Ext[2] because Bit-1=Bit-2=1. Similar computations may be carried out in second computation device 54 to obtain ED_B[0:3], corresponding to the cases of Bit-0=1. Accordingly, first and second computation devices 53 and 54 may comprise appropriately-connected adders, and may also include one or more memory elements (e.g., but not limited to, flip-flops, shift-registers, or memory). Respective maximum selection devices or circuits 55 and 56 may then be used to select the respective maximum values out of ED_A[0:3] and ED_B[0:3]; these may be constructed as "max-of" circuits, nested comparator circuits, or in some other fashion. The maximum of ED_A[0:3] may then be subtracted from the maximum value of ED_B[0:3] using adder circuit 57. The result may be added to the value LLR_Ext[0] at adder circuit 58 to obtain a new, updated value of LLR[0], which may be a log-likelihood ratio corresponding to Bit-0. As shown in FIGS. 6 and 7, corresponding LLRs may be computed for Bit-1 and Bit-2.

Figure 8:
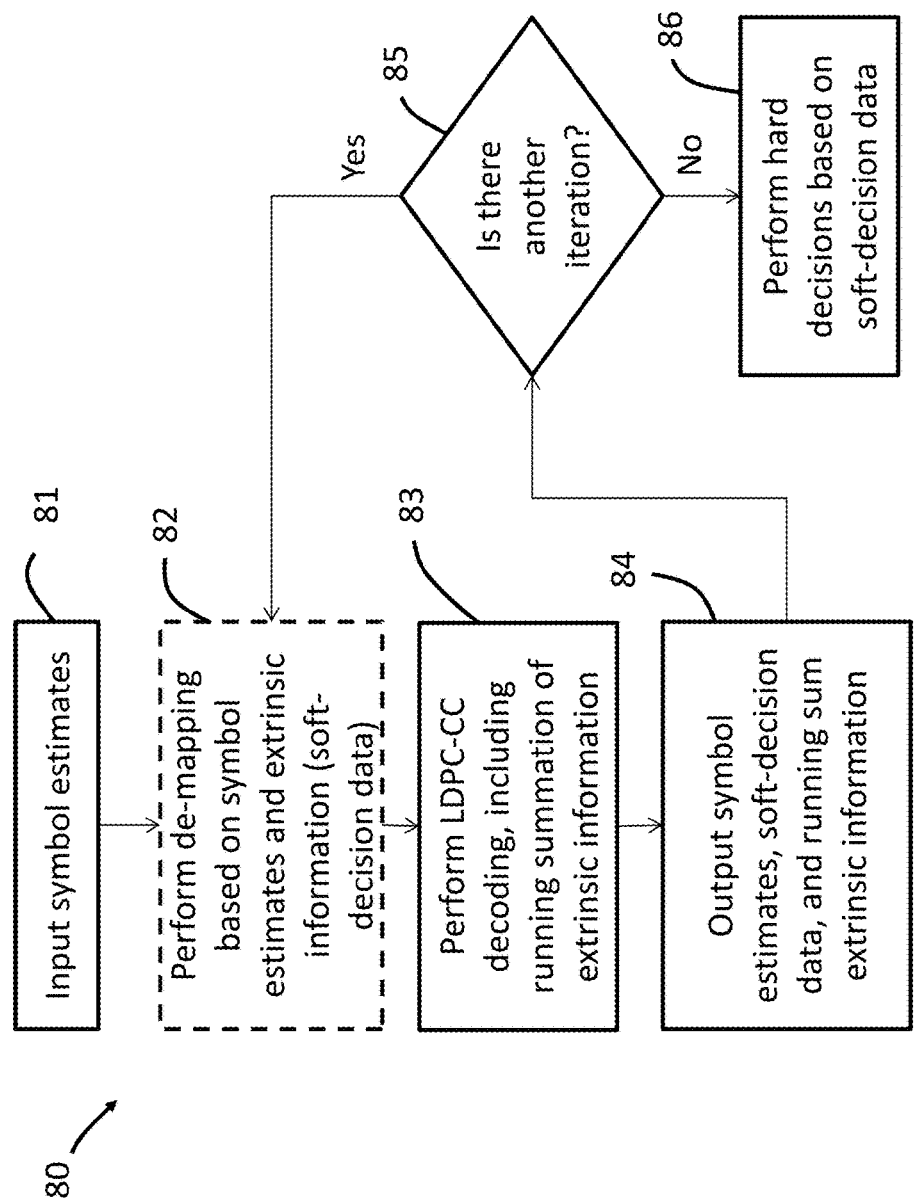
FIG. 8 shows a conceptual flowchart of a method according to various aspects of the present disclosure.

FIG. 8 shows a conceptual flowchart 80 of a method according to various aspects of the present disclosure. Specifically, FIG. 8 relates to the iterative de-mapping/decoding process corresponding to FIGS. 3A, 3B, . . . 7. Symbol estimates may be input 81, e.g., from a symbol de-interleaver 18, as shown in FIG. 1. The symbols may be de-mapped 82; as shown in FIG. 3B, this may use soft-decision data received from a previous stage, if there is a previous stage. The de-mapping 82 may generate soft-decision data that may be used to perform LDPC-CC decoding 83, where running summations of extrinsic information (the aforementioned "messages") may be performed. The LDPC-CC decoding may output the symbol estimates, soft-decision data, and the running sum extrinsic information. If there is a further stage 85, these may be fed back to de-mapping 82. If not, the soft-decision data may be used to determine bit values, e.g., using hard decisions 86.

It is further noted that the ICM may involve various modulation types, and the above-described techniques may be used with such other modulation types. In particular, while the illustrated example of FIGS. 1-7 uses 8QAM, the above methods and apparatus may be modified accordingly to accommodate other types of modulation, such as extended binary phase-shift keying (eBPSK), other dimensions of QAM (e.g., but not limited to, 2.5QAM, 3QAM, 5QAM and 7QAM), et al.

Various aspects of the disclosure have now been discussed in detail; however, the invention should not be understood as being limited to these aspects. It should also be appreciated that various modifications, adaptations, and alternative embodiments thereof may be made within the scope and spirit of the present invention.

What is claimed is:

1. A communication apparatus, including:
   a receiver that receives optical signals, the receiver having an optical hybrid circuit and a local oscillator laser, the optical hybrid circuit mixing at least portions of the received optical signals with light supplied by the local oscillator laser, the receiver outputting first electrical signals;
   a digital signal processor coupled to the receiver, the digital signal process outputting second electrical signals based on the first electrical signals;
   a symbol de-interleaver coupled to the digital signal processor, the symbol de-interleaver supplying third electrical signals based on the second electrical signals,
   a multi-stage feed-forward iterative decoder that receives the third electrical signals, comprising at least two stages, wherein a respective one of the at least two stages includes:
   an M-ary soft-decision symbol de-mapper configured to de-map received symbol estimates and to output soft decision data corresponding to one or more respective bits corresponding to a given symbol; and
   a low-density parity check convolutional code (LDPC-CC) decoder configured to input the soft-decision data and to combine the soft-decision data with extrinsic decoding information, to compute a running summation of extrinsic decoding information computed within the LDPC-CC decoder, and to output further soft-decision data and extrinsic decoding information computed within the LDPC-CC decoder.

2. The communication apparatus of claim 1, further including:
   a hard decision device configured to receive soft-decision data from an output of a last of the at least two stages and to output bit values.

3. The communication apparatus of claim 1, wherein the soft-decision data and further soft-decision data are log-likelihood ratio values for respective bits corresponding to the symbol estimates.

4. The communication apparatus of claim 1, wherein the de-mapper of at least one of the at least two stages is enabled to be deactivated or bypassed, and wherein the soft-decision data input to the LDPC-CC decoder corresponds to soft-decision data input to the at least one of the at least two stages.

5. The communication apparatus of claim 1, wherein the outputs of a given stage of the at least two stages include the symbol estimates and the further soft-decision data, and the extrinsic decoding information.

6. The communication apparatus of claim 5, wherein the outputs of the given stage are passed as inputs to a next stage of the at least two stages.

7. The communication apparatus of claim 5, wherein the symbol estimates and the soft-decision data, and the extrinsic decoding information comprise multiple values and are passed in parallel.

8. The communication apparatus of claim 1, wherein a respective stage further includes a symbol buffer configured to delay the symbol estimates.

9. The communication apparatus of claim 1, wherein the LDPC-CC decoder comprises a min-sum decoder architecture with parallel branches corresponding to respective constraints of the LDPC-CC decoder.

10. The communication apparatus of claim 1, wherein the de-mapper is configured to compute the soft-decision data using Euclidean distances of symbols from constellation points of modulation used to transmit symbols to the communication apparatus, adjusted by soft-decision data input to the de-mapper from a previous stage, wherein the soft-decision data input to a first stage of the at least two stages is zero for all bits.

11. A method in a communications receiver, the method including:
 receiving optical signals optical signals with an optical receiver;
 mixing at least portions of the received optical signals with light supplied by a local oscillator laser;
 outputting, with the optical receiver, first electrical signals based on the received optical signals;
 outputting, with a digital signal processor coupled to the receiver, second electrical signals based on the first electrical signals;
 outputting, with a symbol de-interleaver coupled to the digital signal processor, third electrical signals based on the second electrical signals;
 performing multi-stage iterative feed-forward decoding based on the third electrical signals, said performing multi-stage iterative feed-forward decoding comprising:
  performing a first de-mapping of symbol estimates and outputting soft-decision bit data for one or more bits corresponding to the symbol estimates;
  performing a first low-density parity check convolutional code (LDPC-CC) decoding based on the soft-decision bit data, using extrinsic decoding information, to output further soft-decision data for the one or more bits corresponding to the symbol estimates and further extrinsic decoding information computed during the LDPC-CC decoding;
  performing a first maintaining of running parallel sums of the further extrinsic decoding information; and
  performing one or more further iterations of de-mapping M-ary symbol estimates, LDPC-CC decoding, and maintaining the running parallel sums based at least in part on outputs of the first de-mapping and the first LDPC-CC decoding.

12. The method of claim 11, further including:
 making hard decisions based on soft-decision data from an output of a last of the one or more further iterations and outputting resulting bit values from the hard decisions.

13. The method of claim 11, wherein the soft-decision bit data and further soft-decision bit data are log-likelihood ratio values for respective bits corresponding to the symbol estimates.

14. The method of claim 11, wherein the performing one or more further iterations comprises, in at least one of the one or more further iterations, bypassing the de-mapping M-ary symbol estimates, wherein the soft-decision bit data input to the LDPC-CC decoding of the at least one of the one or more further iterations, in which the de-mapping is bypassed, corresponds to soft-decision data input to the at least one of the one or more further iterations.

15. The method of claim 11, wherein the outputs of the performing the first de-mapping, performing the first LDPC-CC decoding, and performing the first maintaining, as well as the outputs of the one or more further iterations, include the symbol estimates, the further soft-decision data, extrinsic decoding information resulting from, in the case of the first de-mapping and first-LDPC-CC decoding, as well as in the case of the de-mapping and LDPC-CC decoding of the one or more further iterations.

16. The method of claim 15, wherein the symbol estimates, the soft-decision data, and the extrinsic decoding information comprise multiple values and are output in parallel.

17. The method of claim 11, wherein the performing the first LDPC-CC decoding and the LDPC-CC decoding of the one or more further iterations comprise performing min-sum decoding with parallel branches corresponding to respective constraints of the LDPC-CC decoding.

18. The method of claim 11, wherein the first de-mapping and the de-mapping of the one or more further iterations comprises:
 computing the soft-decision data using Euclidean distances of symbols from constellation points of a modulation type used to transmit the symbols, adjusted by soft-decision data input to the de-mapping from a previous iteration, wherein the soft-decision data input to the first de-mapping is zero for all bits.

19. A non-transitory computer-readable medium containing executable code configured to cause at least one processing device to perform operations including:
 outputting, with a digital signal processor coupled to an optical receiver, first electrical signals based on second electrical signals output from an optical receiver;
 outputting, with a symbol de-interleaver coupled to the digital signal processor, third electrical signals based on the first electrical signals;
 performing multi-stage iterative feed-forward decoding based on the third electrical signals, said performing multi-stage iterative feed-forward decoding comprising:
  performing a first de-mapping of symbol estimates and outputting soft-decision bit data for one or more bits corresponding to the symbol estimates;
  performing a first low-density parity check convolutional code (LDPC-CC) decoding based on the soft-decision bit data, using extrinsic decoding information, to output further soft-decision data for the one or more bits corresponding to the symbol estimates and further extrinsic decoding information computed during the LDPC-CC decoding;
 performing a first maintaining of running parallel sums of the further extrinsic decoding information; and
 performing one or more further iterations of de-mapping M-ary symbol estimates, LDPC-CC decoding, and maintaining the running parallel sums based at least in part on outputs of the first de-mapping and first LDPC-CC decoding.

* * * * *